(12) United States Patent
Catuneanu et al.

(10) Patent No.: US 12,215,933 B2
(45) Date of Patent: Feb. 4, 2025

(54) COMPACT HEAT EXCHANGER WITH WAVY FIN TURBULIZER

(71) Applicant: DANA CANADA CORPORATION, Oakville (CA)

(72) Inventors: Andrei Catuneanu, Oakville (CA); John G. Burgers, Oakville (CA); Kenneth M. A. Abels, Oakville (CA)

(73) Assignee: Dana Canada Corporation, Oakville (CA)

( * ) Notice: Subject to any disclaimer, the term of this patent is extended or adjusted under 35 U.S.C. 154(b) by 746 days.

(21) Appl. No.: 17/107,102

(22) Filed: Nov. 30, 2020

(65) Prior Publication Data

US 2022/0170706 A1   Jun. 2, 2022

(51) Int. Cl.
F28F 3/02 (2006.01)
F28F 13/12 (2006.01)

(52) U.S. Cl.
CPC .............. F28F 13/12 (2013.01); F28F 3/025 (2013.01)

(58) Field of Classification Search
CPC .... F28F 13/12; F28F 3/02; F28F 3/025; F28F 3/06; F28F 3/048; H01M 10/6556; H01M 10/625; H01M 10/613; H01M 10/6569; H01M 2220/20; H05K 7/20254; H05K 7/20872; F02B 29/0462; F28D 2021/0082; F28D 2021/0029; Y02E 60/10
See application file for complete search history.

(56) References Cited

U.S. PATENT DOCUMENTS

| | | |
|---|---|---|
| 5,209,289 A | 5/1993 | Haushalter |
| RE35,890 E | 9/1998 | So |
| 5,927,393 A | 7/1999 | Richter et al. |
| 6,273,183 B1 | 8/2001 | So |
| 8,081,465 B2 | 12/2011 | Nishiura |
| 10,112,270 B2 | 10/2018 | Army, Jr. et al. |
| 2002/0007935 A1 | 1/2002 | Marsala |
| 2004/0069472 A1 | 4/2004 | Shimoya |

(Continued)

FOREIGN PATENT DOCUMENTS

JP   2012186344 A   9/2012

OTHER PUBLICATIONS

English machine translation of JP 2012-186344A Sep. 27, 2012.

(Continued)

*Primary Examiner* — Harry E Arant
(74) *Attorney, Agent, or Firm* — Smart & Biggar LP (57) ABSTRACT

A heat exchanger includes a fluid flow passage with a wavy fin turbulizer. The turbulizer includes sidewalls extending lengthwise along a fluid flow direction between its first and second ends, and the sidewalls are spaced apart across the width of the turbulizer. Each flow channel of the turbulizer is defined between two adjacent sidewalls. Each sidewall has a smoothly and continuously curved profile with repeating wave forms being defined along the length of the turbulizer. The continuously curved profile of the sidewalls is defined by a non-circular shape, such as elliptical, sinusoidal, parabolic and hyperbolic shapes. The radius of curvature changes constantly and reaches a maximum at or near the inflection point between adjacent crests and troughs of the profile, to provide improved particle pass-through, lower pressure drop, and enhanced plateability of internal surfaces.

17 Claims, 10 Drawing Sheets

(56) References Cited

U.S. PATENT DOCUMENTS

| | | | | |
|---|---|---|---|---|
| 2014/0360707 A1* | 12/2014 | Cho | ........................ | F28F 3/025 |
| | | | | 165/165 |
| 2015/0198372 A1* | 7/2015 | Desikan | .............. | H01M 10/613 |
| | | | | 165/151 |
| 2020/0217596 A1* | 7/2020 | Civeira Domínguez | . | F28F 1/40 |

OTHER PUBLICATIONS

"Ruffled and Herringbone Folded Fins—Robinson Fin Machines", 4 pages, retrieved on Apr. 27, 2020, retrieved from the Internet: <http://www.robfin.com/ruffled-herringbone-folded-fins/>.

* cited by examiner

COMPACT HEAT EXCHANGER WITH WAVY FIN TURBULIZER

FIELD

The present disclosure relates to compact automotive heat exchangers, and particularly to compact automotive heat exchangers with a wavy fin turbulizer provided in a fluid flow passage.

BACKGROUND

Compact automotive heat exchangers typically comprise one or more flat cooling plates or tubes having a hollow interior defining one or more internal fluid flow passages for flow of a heat transfer fluid. Heat from an external source is transferred through the plate walls of the heat exchanger to the heat transfer fluid flowing through the heat exchanger. Examples of compact automotive heat exchangers include heat exchangers for cooling automotive battery cells and/or power electronic modules, and charge air coolers.

A turbulizer may be provided in the hollow interior of the heat exchanger to disturb fluid flow and enhance heat transfer. Turbulizers are typically corrugated structures, such as rectangular fins, offset strip fins, louvered fins, and wavy fins. Examples of offset strip fins are disclosed in U.S. Pat. No. Re. 35,890 (So) and U.S. Pat. No. 6,273,183 (So et al.), which are incorporated herein by reference in their entireties. Examples of wavy fins are disclosed in US 2002/0007935 A1 (Marsala), US 2014/0360707 A1 (Cho), US 2015/0198372 A1 (Desikan et al.), and U.S. Pat. No. 5,209,289 (Haushalter), which are incorporated herein by reference in their entireties.

Balancing the heat transfer performance of a turbulizer against its pressure drop is a major challenge in heat exchanger design, since greater heat transfer is generally achieved at the expense of greater pressure drop. Another important requirement is that heat exchangers must have a geometry to enable particles present in the working fluid to pass unimpeded through the turbulizer.

A typical wavy fin turbulizer comprises a number of identical flow channels having a regular repeating pattern, with fixed wavelength and fixed amplitude, in what would resemble a wave. A wavy fin turbulizer can be optimized with regard to heat transfer performance and pressure drop by changing one or more of wavelength, amplitude, channel width and channel spacing.

The inventors have found that optimizing a wavy fin turbulizer with sole regard to its heat transfer performance may cause difficulties with particle pass-through. For example, due to manufacturing limitations, the flow channels of a wavy fin turbulizer tend to exhibit some variability in channel width, resulting in regions of the turbulizer in which the actual channel width is wider and/or narrower than the nominal channel width. The degree of widening and narrowing of the flow channels depends on the relative amplitude and wavelength of the wave pattern, and the thickness of the sheet material comprising the turbulizer. In some cases, the flow channels may have regions which are too narrow to ensure unimpeded passage of particles, and the turbulizer may fail to meet particle pass-through requirements. As a result, it may be necessary to increase the nominal channel width to ensure that particles in the fluid will pass through the narrowest regions of the turbulizer flow channels. This widening of the flow channels to improve particle pass-through can, however, have a severe impact on heat transfer performance.

Furthermore, it is sometimes required to plate all internal surfaces of a compact automotive heat exchanger with a thin, uniform layer of metal. The inventors have found that it can be difficult to achieve full coverage and/or uniform thickness of the plating metal without negatively impacting overall heat transfer performance. For example, in conventional heat exchanger design, it is desirable to minimize the width of bypass flow passages in the spaces between the outer edge surfaces of a turbulizer and the flow channel walls of the heat exchanger. However, in the case of a wavy fin turbulizer, these bypass channels (also referred to herein as "side channels") are of irregular width and may include regions which are too narrow to permit sufficient contact with the plating solution.

There is a need for an improved wavy fin turbulizer design to avoid the above-mentioned problems, and to provide a compact automotive heat exchanger which balances heat transfer performance with pressure drop, while meeting particle pass-through requirements and, where applicable, requirements for internal plating.

SUMMARY

In an embodiment, there is provided a heat exchanger assembly having a fluid flow passage provided with a wavy fin turbulizer. The turbulizer comprises a plurality of sidewalls and a plurality of flow channels. The sidewalls extend lengthwise along a fluid flow direction between a first end and a second end of the turbulizer, and are spaced apart across a width of the turbulizer. Each flow channel is defined between two sidewalls which are adjacent to one another, each flow channel having a first open end at the first end of the turbulizer and a second open end at the second end of the turbulizer. Each sidewall has a smoothly and continuously curved profile comprising a plurality of wave forms defined along the length of the turbulizer. The wave forms comprise a plurality of alternating crests and troughs, each wave form having a wavelength and an amplitude. The continuously curved profile of the sidewalls is defined by a non-circular shape.

According to an aspect, the non-circular shape is a non-circular conic section. The non-circular shape may be selected from the group consisting of sinusoidal, elliptical, parabolic and hyperbolic.

According to an aspect, the continuously curved profile includes inflection points between adjacent crests and troughs, and wherein a radius of curvature at the inflection points is greater than a radius of curvature at the crests and troughs.

According to an aspect, a first included angle between the continuously curved profile and an imaginary straight line through the inflection points, measured at one of the inflection points, is less than a second included angle between a sidewall with a circular profile having the same amplitude and wavelength and the imaginary straight line, measured at one of the inflection points.

According to an aspect, the flow channels of the turbulizer have a nominal flow channel width and a minimum flow channel width, wherein the minimum flow channel width is about 85-95% of the nominal flow channel width.

According to an aspect, each crest and each trough has an apex at which the flow channel width is at a maximum and is substantially equal to the nominal flow channel width, and wherein the flow channel width is substantially equal to the minimum flow channel width at or proximate to the inflection points.

According to an aspect, the heat exchanger assembly further comprises a first plate wall and a second plate wall spaced apart from one another. The first and second plate walls each have an inner surface and an outer surface, wherein the fluid flow passage is defined between the inner surfaces of the first and second plate walls.

According to an aspect, the wavy fin turbulizer further comprises a plurality of top walls and a plurality of bottom walls, wherein each of the top walls joins top edges of a pair of adjacent sidewalls and each of the bottom walls joins bottom edges of a pair of adjacent sidewalls, such that the wavy fin turbulizer comprises a plurality of longitudinally-extending corrugations arranged across its width.

According to an aspect, the top walls of the wavy fin turbulizer are in contact with the inner surface of the first plate wall and the bottom walls of the wavy fin turbulizer are in contact with the inner surface of the second plate wall.

According to an aspect, the wavy fin turbulizer comprises first and second longitudinal side edges, and the heat exchanger assembly further comprises a peripheral sidewall enclosing outer peripheral edges of the fluid flow passage, the peripheral sidewall including first and second longitudinally extending portions. A first side channel is defined between the first longitudinal side edge of the turbulizer and the first longitudinally extending portion of the peripheral sidewall, and a second side channel is defined between the second longitudinal side edge of the turbulizer and the second longitudinally extending portion of the peripheral sidewall. The first and second side channels have alternating wide and narrow areas differing in width by about twice the amplitude of the wave forms.

According to an aspect, the interior surfaces of the fluid flow passage, including the turbulizer, the inner surfaces of the first and second plate walls, and the peripheral sidewall, include a thin layer of metal plating.

According to an aspect, each of the first and second side channels has a minimum side channel width which is defined by a width of one or more of the narrow areas. The minimum side channel width may be at least ⅓ of the width of the flow channels of the turbulizer.

According to an aspect, the wavy fin turbulizer is substantially centered between the first and second longitudinally extending portions of the peripheral sidewall, such that the first and second side channels are of substantially the same width.

According to an aspect, the heat exchanger assembly further comprises a plurality of positioning elements provided along the side edges of the wavy fin turbulizer. A plurality of these positioning elements may be provided along each of said side edges.

According to an aspect, each of the positioning element projects inwardly from the inner surface of one of the first and second plate walls.

According to an aspect, the profile of the wavy fin turbulizer is varied along its length and/or its width, by varying one or more of the non-circular shape, amplitude, wavelength, and flow channel width.

According to an aspect, the wavy fin turbulizer is integrally formed with the first plate wall. The sidewalls may project from and/or may be directly connected to the inner surface of the first plate wall.

BRIEF DESCRIPTION OF DRAWINGS

The invention will now be described, by way of example only, with reference to the accompanying drawings in which.

DETAILED DESCRIPTION

The example embodiments described herein relate to compact automotive heat exchangers having a fluid flow passage provided with a wavy fin turbulizer. The heat exchangers described herein may be configured as cooling plates for cooling heat-generating components such as power electronics components for battery or hybrid electric vehicles. Examples of power electronics components include transistors, diodes, resistors, capacitors, inductors, field effect transistors (FETS), isolated gate bipolar transistors (IGBTs), wide-bandgap semiconductors, power inverters, DC to DC converters, DC to AC converters, and combinations thereof. The heat exchangers may be configured for cooling other heat-generating components in conventional or electric vehicles, such as battery cells. Alternatively, the heat exchangers described herein may be configured as gas to liquid heat exchangers, such as charge air coolers, for cooling a hot gas stream flowing over the exterior surfaces of the heat exchanger.

An embodiment of a compact automotive heat exchanger 10 for cooling one or more heat-generating components 12 is described below with reference to FIGS. 1 to 6.

Figure 1:
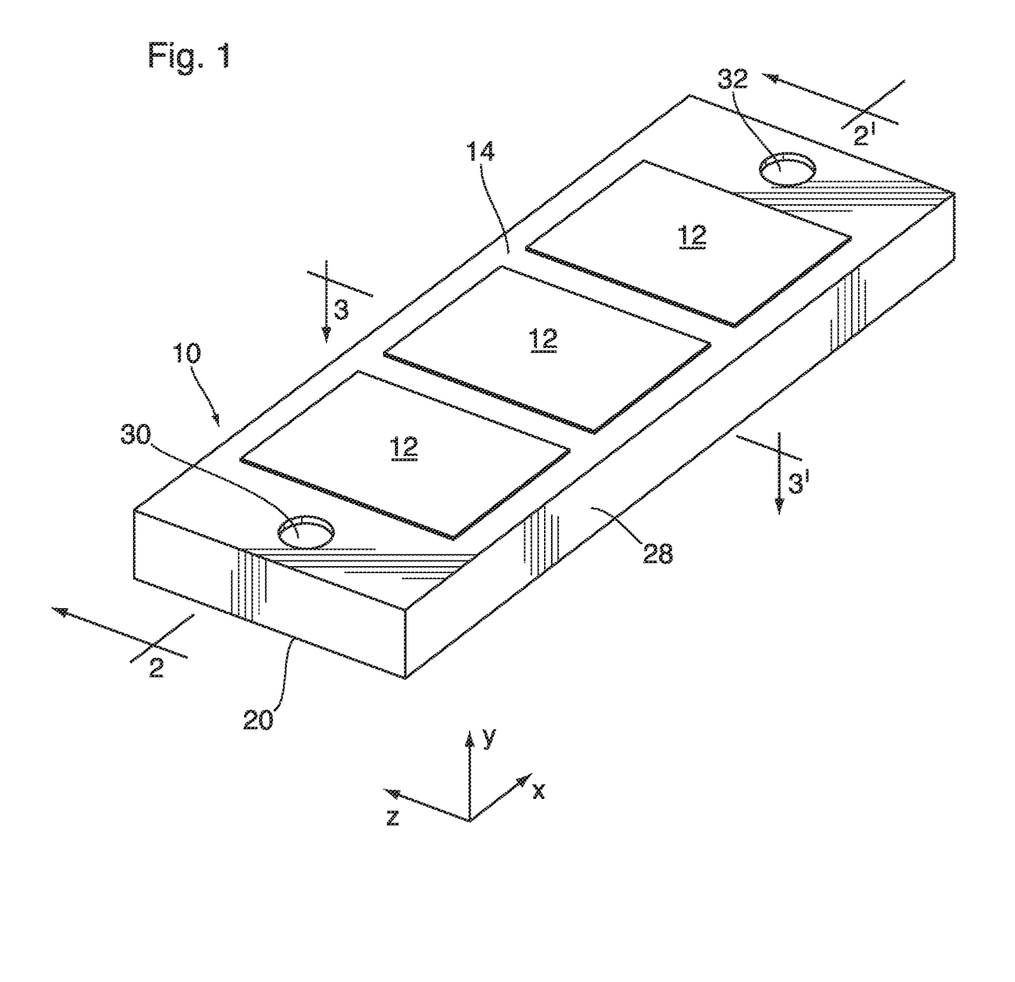
FIG. 1 is a top perspective view of a compact automotive heat exchanger according to an embodiment.
Figure 2:
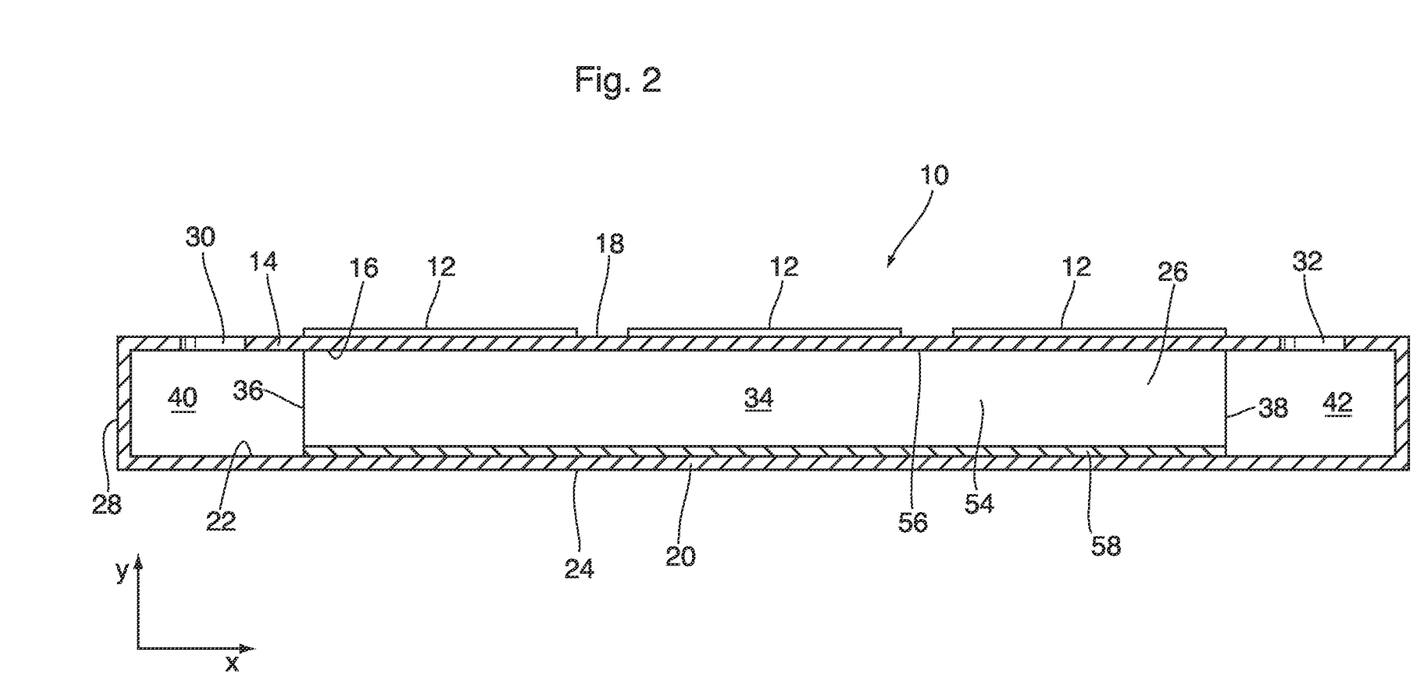
FIG. 2 is a longitudinal cross-section through the heat exchanger of FIG. 1, along line 2-2' of FIG. 1.

Compact automotive heat exchanger 10 is generally flat and planar, in the form of a flat elongate tube, having an area in a first plane (xz plane) and a thickness in a second plane (yz plane), the thickness of heat exchanger 10 being relatively small in comparison to its width and length. The heat exchanger 10 comprises a first plate wall 14 having an inner surface 16 and an opposite outer surface 18, and a second plate wall 20 having an inner surface 22 and an outer surface 24. The outer surface 18 of the first plate wall 14 is adapted for thermal contact with the heat-generating component 12, typically through an electrically insulating substrate (such as a layer of thermal interface material or "TIM") and is also referred to herein as the outer heat transfer surface.

The first and second plate walls 14, 20 are generally flat and parallel to each other, and spaced apart in the thickness dimension of the cooling plate 10. A fluid flow passage 26 for circulation of a heat transfer fluid is defined between the inner surfaces 16, 22 of the first and second plate walls 14, 20, and is enclosed at its outer peripheral edges by a peripheral sidewall 28 which connects the first and second plate walls 14, 20.

Heat exchanger 10 further comprises an inlet port 30 and an outlet port 32 spaced apart in the first plane and in fluid communication with the fluid flow passage 26. In the present embodiment, the inlet and outlet ports 30, 32 each comprise apertures in the first plate wall 14, however, it will be appreciated that the inlet and outlet ports 30, 32 may have different configurations. For example, one or both of the inlet and outlet ports 30, 32 may instead be formed in the second plate wall 20 or in the peripheral sidewall 28. Alternatively, the inlet and outlet ports 30, 32 may comprise through-openings formed through both the first and second plate walls 14, 20. Although not shown in the drawings, the inlet and outlet ports 30, 32 may be provided with fittings for connection to fluid conduits.

The fluid flow passage 26 contains a wavy fin turbulizer 34, which may be formed by stamping, folding and/or rolling of a thin sheet of metal which is inserted between the plate walls 14, 20 during assembly of heat exchanger 10. Instead of being separately formed from a sheet of metal, the wavy fin turbulizer 34 may be integrally formed with one of the plate walls 14 or 20, for example by machining or impression casting wavy fins onto a flat plate, or by integrally forming the flat plate with wavy fins by casting. In other embodiments, the wavy fins may be metallurgically bonded to one of the plate walls 14 or 20, for example by brazing. For example, the plate wall 14 or 20 (with the integrally formed or metallurgically bonded wavy fins) may comprise a cover of a flow passage formed in a cast housing of a compact automotive heat exchanger.

In the embodiments shown in the drawings, the wavy fin turbulizer 34 is separately formed from a sheet of metal and inserted between plate walls 14 or 20 during assembly of heat exchanger 10. However, unless otherwise indicated, the following discussion also applies to embodiments where the wavy fin turbulizer 34 is either formed with or bonded to one of the plate walls 14 or 20 before it is inserted into the fluid flow passage 26.

Figure 3:
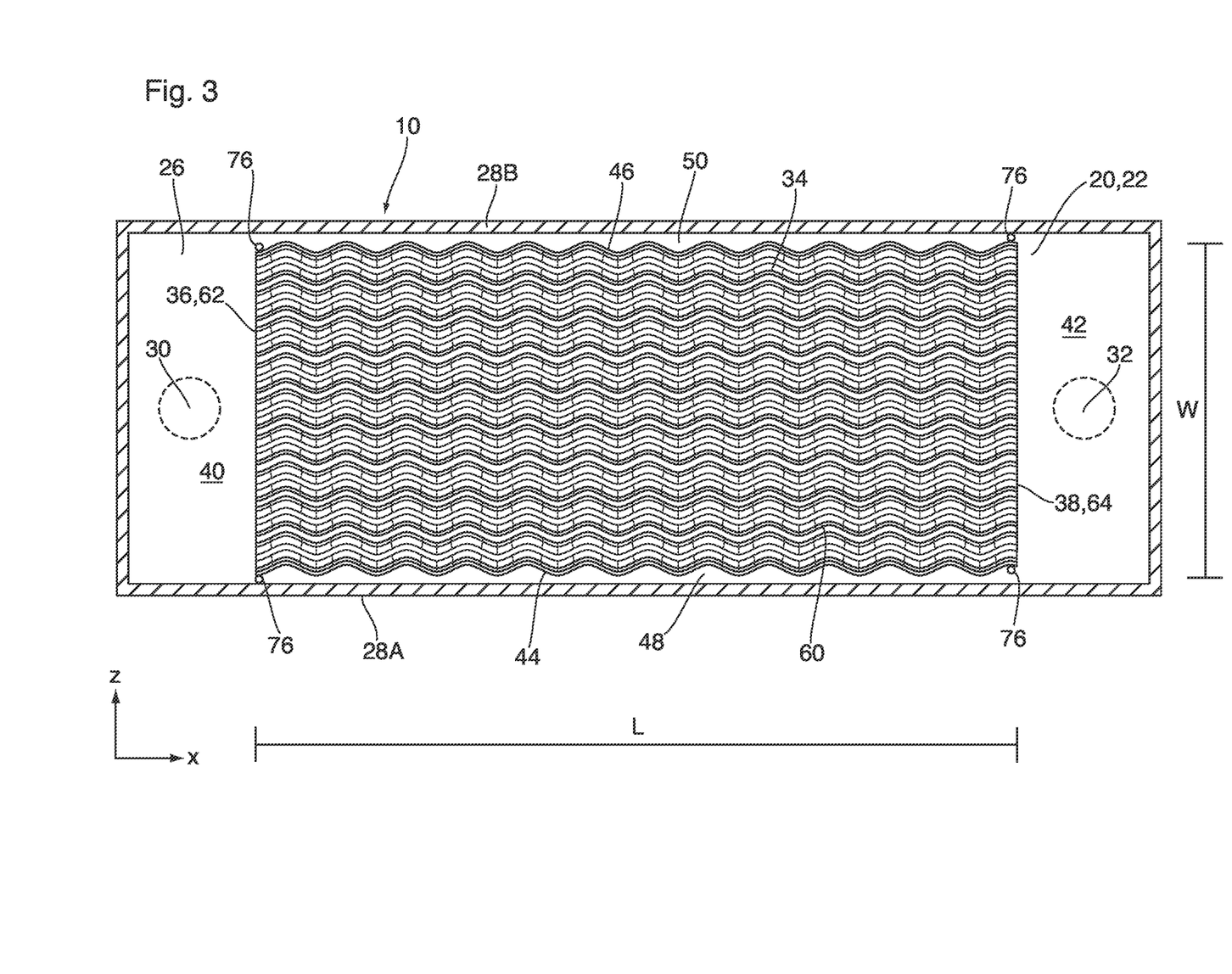
FIG. 3 is a cross-sectional plan view of the heat exchanger of FIG. 1, along line 3-3' of FIG. 1.
Figure 4:
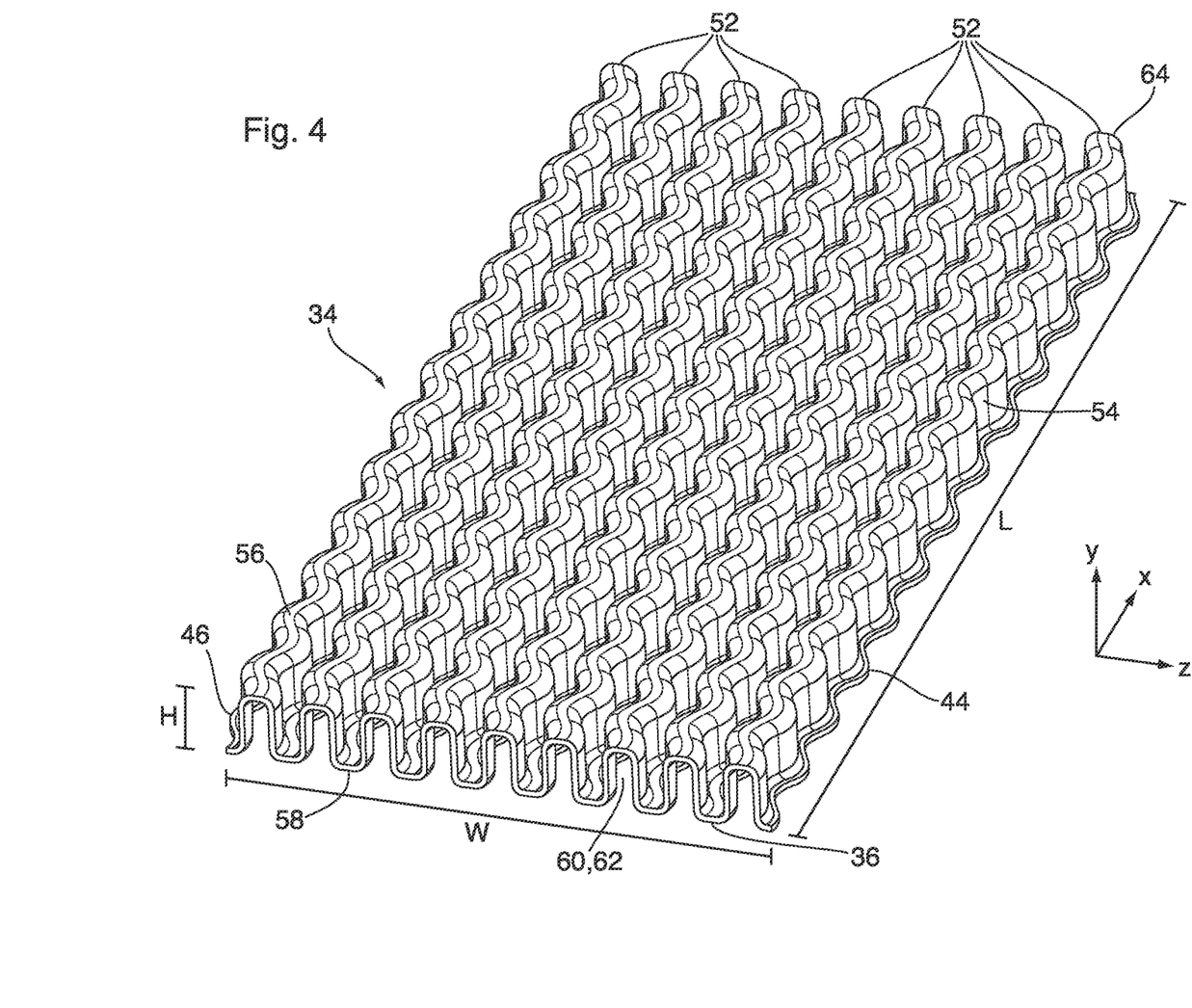
FIG. 4 is a top perspective view of the wavy fin turbulizer of the heat exchanger of FIG. 1.
Figure 5:
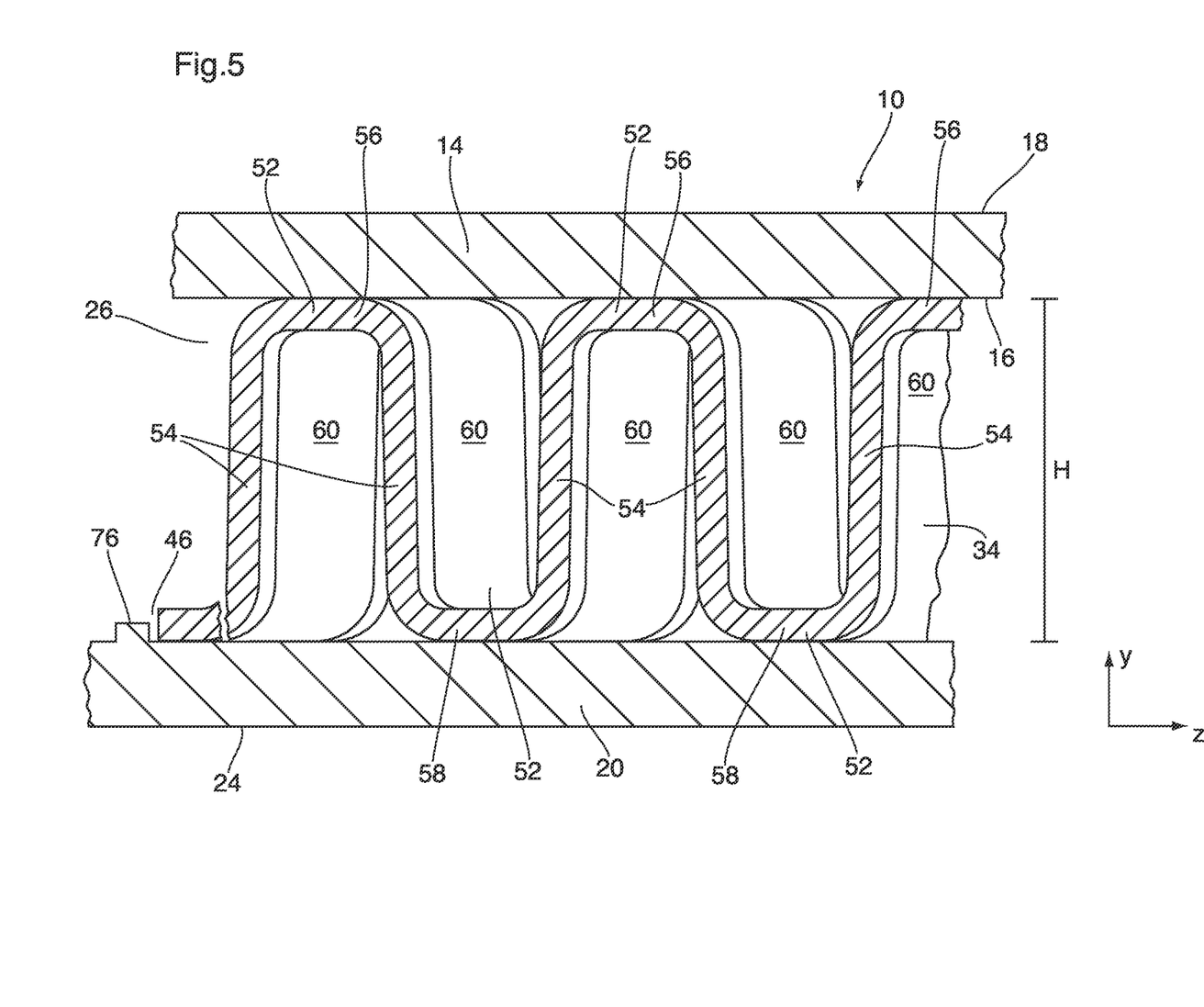
FIG. 5 is an enlarged, partial end view of the wavy fin turbulizer of FIG. 4 enclosed between the plate walls of the heat exchanger of FIG. 1.

As shown in FIGS. 3 and 4, the turbulizer 34 has a length L (x-axis) and a width W (z-axis), and has a rectangular shape. As shown in FIGS. 4 and 5, turbulizer 34 has height H (y-axis). The length L is such that the turbulizer 34 fits lengthwise between the inlet and outlet ports 30, 32, the turbulizer 34 having first and second ends 36, 38 which are spaced apart longitudinally (along x-axis). The first end 36 of turbulizer 34 is located proximate to inlet port 30, with an inlet manifold space 40 optionally provided between inlet port 30 and the first end 36 of turbulizer 34. The second end 38 of turbulizer 34 is located proximate to the outlet port 32, with an outlet manifold space 42 optionally provided between outlet port 32 and the second end 38 of turbulizer 34.

The turbulizer 34 has first and second longitudinal side edges 44, 46, which extend along the x-axis and are transversely spaced apart (along z-axis) from each other. The width W of turbulizer 34 is such that it fits between the longitudinal portions of peripheral sidewall 28. As shown in FIG. 3, the first side edge 44 of turbulizer 34 is located proximate to a first longitudinal portion of peripheral sidewall 28 (labelled 28A), and the second side edge 46 of turbulizer 34 is located proximate to a second longitudinal portion of peripheral sidewall 28 (labelled 28B). It can be seen from FIG. 3 that there are side channels 48, 50 between the side edges 44, 46 of turbulizer 34 and the respective longitudinal portions 28A, 28B of peripheral sidewall 28, these side channels 48, 50 extending throughout the length of the turbulizer 34. In conventional heat exchanger design, the width of side channels 48, 50 is minimized, since they permit bypass flow around the side edges 44, 46 of turbulizer 34, and therefore have a negative effect on heat transfer performance. However, in the present embodiment, the width of side channels 48, 50 is not necessarily minimized, for reasons discussed below.

As shown in FIG. 5, the height H of turbulizer 34 is such that the turbulizer 34 is in contact with the inner surfaces 16, 22 of the first and second plate walls 14, 20. In some embodiments, the turbulizer 34 may be metallurgically bonded to one or both of the inner surfaces 16, 22, for example by brazing, to enhance heat conduction.

The turbulizer 34 comprises a plurality of longitudinally-extending corrugations 52 arranged in a regular repeating pattern across its width W. The corrugations 52 comprise longitudinally-extending sidewalls 54 extending from the first end 36 to the second end 38 of turbulizer 34. Where the wavy fin turbulizer 34 is formed from a separate sheet of metal, each sidewall 54 is joined to an adjacent sidewall 54 along its top or bottom edge by a top wall 56 or a bottom wall 58, shown in FIG. 5. The terms "top" and "bottom" as used herein are used for the purpose of illustration only, and do not imply that the turbulizer 34 must have a specific orientation when in use.

In cases where the wavy fin turbulizer 34 is formed with or bonded to one of the plate walls 14 or 20 before it is inserted into the fluid flow passage 26, it does not necessarily include top walls 56 and/or bottom walls 58. In such embodiments, the wavy fin turbulizer 34 may simply comprise fin-like sidewalls 54 projecting directly from the plate wall 14 or 20 on which the turbulizer 34 is mounted, typically at an angle of 90 degrees to the plate wall 14 or 20.

The sidewalls 54 may be substantially regularly spaced apart across the width W of turbulizer 34, with flow channels 60 being defined between the sidewalls 54. As shown in FIG. 5, the sides of flow channels 60 are enclosed by sidewalls 54, while the top and bottom of each flow channel 60 is enclosed by a top or bottom wall 56, 58, and an inner surface 16, 22 of one of the plate walls 14, 20. In embodiments where the wavy fin turbulizer 34 is formed with or bonded to one of the plate walls 14 or 20 before it is inserted into the fluid flow passage 26, the top and bottom of each flow channel 60 may be enclosed by an inner surface 16, 22 of one of the plate walls 14, 20.

The flow channels 60 have first and second open ends 62, 64 at the first and second ends 36, 38 of turbulizer 34. In the present embodiment, the sidewalls 54 of turbulizer 34 are free of perforations such as would be provided in an offset strip fin or a louvered fin. Therefore, all or substantially all the fluid entering any flow channel 60 at its first open end 62 will be discharged from its second open end 64.

In operation, heat transfer fluid enters the fluid flow passage 26 through inlet port 30 and is distributed transversely in inlet manifold space 40. The fluid enters the first open ends 62 of flow channels 60. As it flows through the length of turbulizer 34, the fluid absorbs heat from an external source, such as a heat-generating component 12 or a hot gas stream, the heat being conducted through one or both plate walls 14, 20. The fluid is discharged from the turbulizer 34 through the second open ends 64 of flow channels 60, entering the outlet manifold space 42 and then exiting the fluid flow passage 26 through the outlet port 32.

Figure 6:
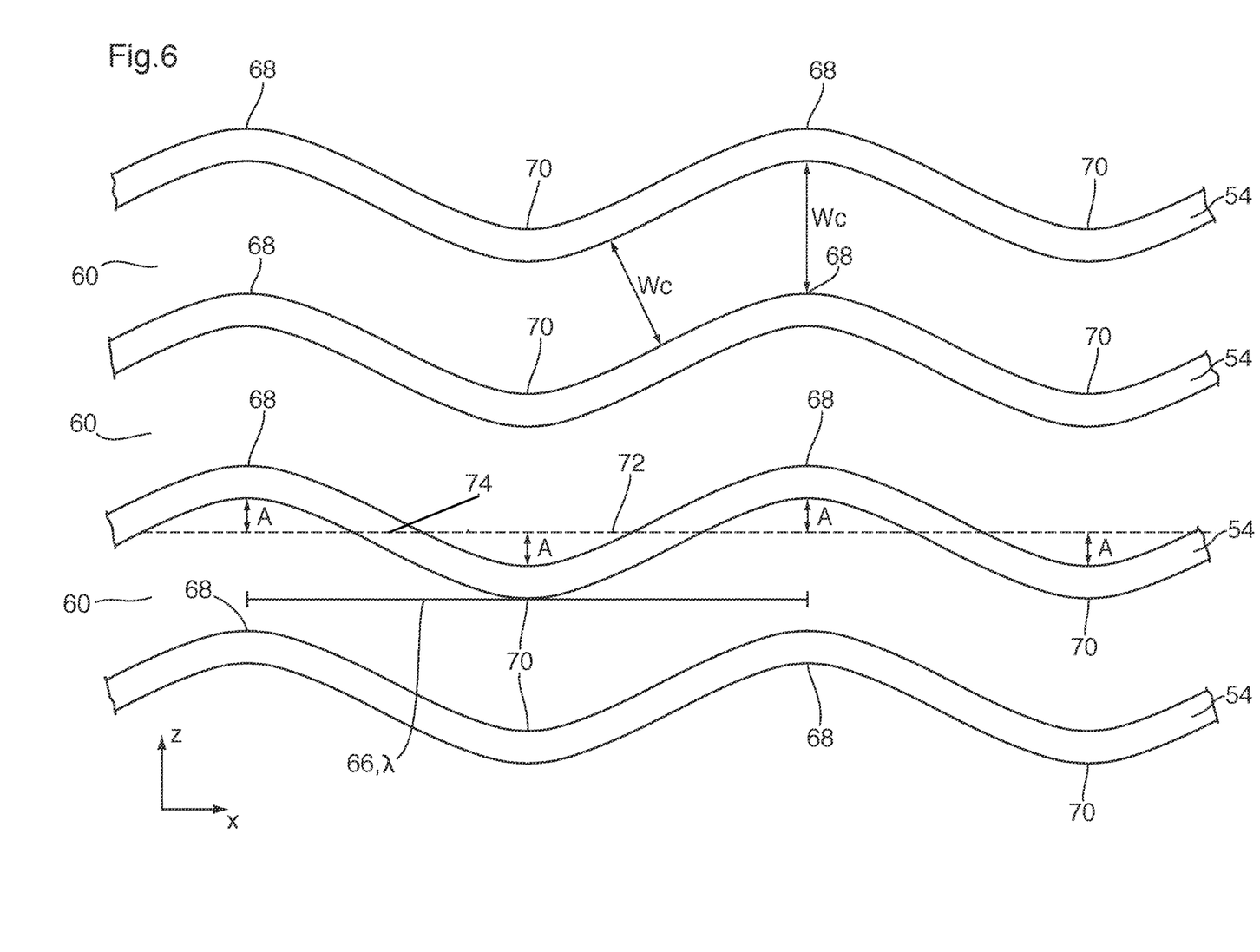
FIG. 6 is an enlarged, partial cross-sectional plan view of the wavy fin turbulizer of FIG. 4.

The flow channels 60, sidewalls 54, top walls 56 and bottom walls 58 of wavy fin turbulizer 34 each have an undulating, serpentine profile (shape), which can be seen when the turbulizer 34 is viewed in plan view, either from the top or the bottom. As shown in FIG. 6, each sidewall 54 and flow channel 60 of the turbulizer 34 comprises a periodic curve made up of a plurality of wave forms 66 defined along the length of turbulizer 34, and comprising alternating crests 68 and troughs 70. The crests and troughs 68, 70 of adjacent sidewalls 54 and flow channels 60 are transversely aligned across the width W of turbulizer 34, as shown in FIG. 6.

Each wave form 66 has a wavelength λ defined in the longitudinal direction (x-axis) between two adjacent crests 68 or troughs 70, and an amplitude A defined in the transverse direction (z-axis), wherein the crests 68 and troughs 70 are spaced apart along the z-axis by twice the amplitude A.

The amplitude A is at a maximum at the crests 68 and troughs 70, and the amplitude A is zero along an imaginary centerline 72 of a sidewall 54 or flow channel 60. The imaginary centerline 72 is a straight longitudinal line (shown as a dotted line in FIG. 6) which is midway between the crests 68 and troughs 70, and also marks the inflection points 74 between adjacent crests 68 and troughs 70. If each crest 68 is considered a convex curve and each trough 70 is considered a concave curve, the inflection points 74 mark the points along the curve where the curvature changes from convex to concave. The transitions between convex and concave curves at inflection points 74 in turbulizer 34 are smooth transitions.

As mentioned above, the flow channels 60 are defined between the sidewalls 54 of turbulizer 34. Therefore, the widths of flow channels 60 are defined by the spacing (pitch) of sidewalls 54, and by the thickness of the sheet material comprising turbulizer 34. In the present embodiment, all the flow channels 60 have the same nominal channel width Wc throughout the length L of turbulizer 34, and the actual channel width Wc any point is determined by measuring across the flow channel 60 at an angle of about 90 degrees to the sidewalls 54 defining the flow channel 60. For example, FIG. 6 shows the channel width Wc at a crest 68, and between a crest 68 and a trough 70, at or proximate to an inflection point 74. In the present example, the channel width Wc at the inflection point is about 88% of the channel width Wc at the crest 68, which is substantially the same as the nominal channel width Wc.

The sidewalls 54 and flow channels 60 are smoothly curved throughout the length L of turbulizer 34, free of any angular crests 68 and/or troughs 70. The sidewalls 54 and flow channels 60 have constant curvature throughout their length, and are free of any completely flat and straight sections connecting the crests 68 and troughs 70.

In addition to having constant curvature, the crests 68 and troughs 70 of turbulizer 34 have a non-circular shape or profile, with the radius of curvature constantly changing throughout the period of each wave form 66 making up the turbulizer 34. Therefore, each wave form 66 making up the profile of the turbulizer 34 has an infinite number of radii, with a minimum radius at the crests 68 and troughs 70, and a maximum radius at the inflection points 74. This results in a smoothly curved, yet relatively flat and straight transition through the inflection points 74 between the crests 68 and troughs 70. The use of the word "flat" with regard of the transition through the inflection point does not mean that the sidewall 54 or flow channels 60 lacks curvature, but rather refers to the included angle between the sidewall 54 and the imaginary line 72, at the point of inflection 74.

Examples of non-circular curves on which the profile of wavy fin turbulizer 34 may be based include non-circular conic section. Exemplary shapes include elliptical, sinusoidal, parabolic and hyperbolic.

Conventional wavy fin turbulizers generally have a circular profile, with each crest and trough describing a circular arc of constant radius. In a wavy fin turbulizer having a circular profile there is a more pronounced transition at the inflection points between the (convex) crests and the (concave) troughs, with a higher angle relative to line 72, than in a comparable wavy fin turbulizer 34 based on a non-circular curve as discussed herein, having the same amplitude and wavelength.

The inventors have found that wavy fin turbulizers 34 as described herein have a lower pressure drop than comparable wavy fin turbulizers with a circular profile, and with the same wavelength and amplitude. In addition, the inventors have found that the non-circular profiles of the wavy fin turbulizers 34 described herein have a beneficial effect on particle pass-through. The inventors believe that these benefits are at least partly due to the degree of flatness of the curve profile between the crests 68 and troughs 70, particularly in the region of the inflection points 74, which results in reduced flow channel narrowing. This is now explained with reference to FIG. 7, which compares the curvature of a hyperbolic wavy fin turbulizer and a circular wavy fin turbulizer through one half of a wavelength, i.e. between a crest 68 and a trough 70.

Figure 7:
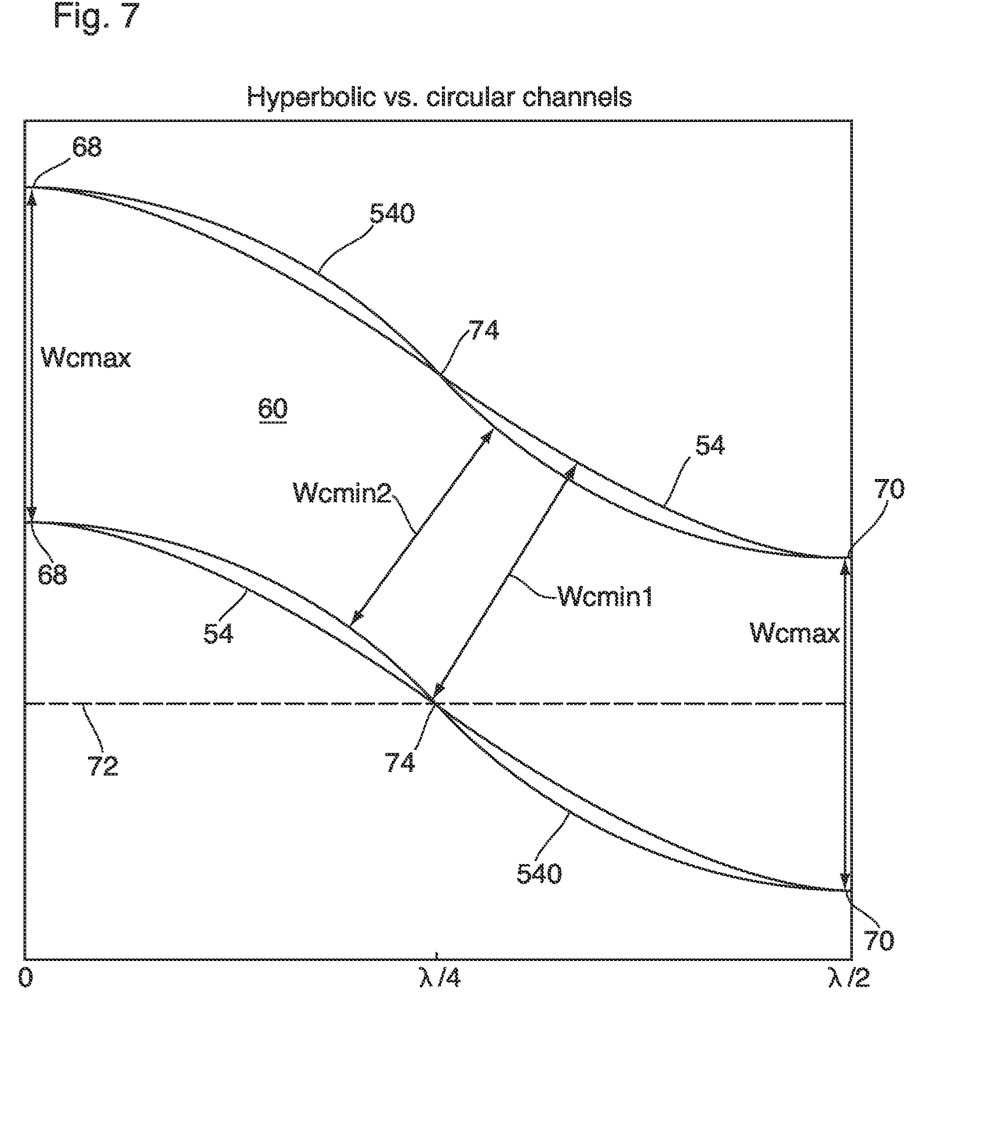
FIG. 7 is a comparison of hyperbolic and circular profiles in a wavy fin turbulizer.

FIG. 7 shows a pair of sidewalls 54 (solid lines) having a hyperbolic profile, as may be provided in a wavy fin turbulizer 34 described herein. FIG. 7 also shows a pair of sidewalls 540 (dotted lines) having a continuously curved circular profile, as may be provided in a conventional wavy fin turbulizer. Because the sidewalls 54 and 540 are superimposed, a single number 60 is used to identify a flow channel between sidewalls 54 and a flow channel between sidewalls 540. The inflection points 74, crests 68 and troughs 70 of sidewalls 54 and 540 are similarly identified in FIG. 7. The sidewalls 54 and 540 have the same wavelength and amplitude.

Due to their circular profile, the sidewalls 540 have a constant radius between the crest 68 or trough 70 and the inflection point 74. The constant circular radius provides the sidewalls 540 with a relatively pronounced curvature in the area of the inflection point 74. In contrast, the hyperbolic profile of sidewalls 54 has greater curvature at the crest 68 and trough 70, and lesser curvature in the area of the inflection point 74. As a result, the hyperbolic profile of sidewalls 54 produces a flatter, straighter transition through the inflection point 74 as compared to the circular profile of sidewalls 540. This can be seen by comparing the angles between the sidewalls 54 and 540 and an imaginary horizontal line 72 passing through the inflection points. The included angle between horizontal line 72 and sidewall 540 is greater than the angle between horizontal line 72 and sidewall 54.

The flatter, straighter transition of the hyperbolic profile of sidewalls 54 also results in a smaller degree of flow channel narrowing than the circular profile of sidewalls 540. It this regard, the hyperbolic and circular curves of sidewalls 54 and 540 converge at the crests 68 and troughs 70, which are the points of maximum channel width. Therefore, the maximum channel widths are the same for the hyperbolic profile of sidewalls 54 and the circular profile of sidewalls 540, and are indicated by Wcmax in FIG. 7. The minimum channel widths between sidewalls 54 and 540 are indicated by Wcmin1 and Wcmin2 in FIG. 7, respectively, and are at or proximate to the inflection point 74.

It can be seen from FIG. 7 that the minimum channel width Wcmin1 between hyperbolic sidewalls 54 (about 85% of Wcmax) is greater than the minimum channel width Wcmin2 between circular sidewalls 540 (about 74% of Wcmax). In general, the maximum degree of flow channel narrowing in wavy fin turbulizers 34 according to embodiments described varies from about 5-15%, whereas the maximum degree of flow channel narrowing in comparable conventional wavy fin turbulizers, with the same wavelength and amplitude, is about 20-30%. In other words, in the wavy fin turbulizers 34 described herein, the flow channels 60 of the turbulizer 34 have a nominal flow channel width and a minimum flow channel width, wherein the minimum flow channel width is about 85-95% of the nominal flow channel width. In general, the degree of flow channel narrowing in wavy fin turbulizers increases with increasing amplitude and/or decreasing wavelength.

The smaller degree of flow channel narrowing in the wavy fin turbulizers 34 according to embodiments described herein provide turbulizers 34 with lower pressure drop. In addition, because the minimum channel width in turbulizers 34 is closer to the nominal channel width, the turbulizers 34 described herein have better particle pass-through than conventional wavy fin turbulizers. This reduces the need to increase the nominal channel width of a turbulizer 34 as described herein, to meet particle pass-through requirements. This difference in flow channel narrowing is significant and allows greater flexibility in specifying the nominal channel width to accommodate strict particle pass-through requirements without unduly sacrificing heat transfer performance.

As mentioned above, FIG. 7 shows the profile of a conventional wavy fin turbulizer having a continuously curved circular profile. In some conventional wavy fin turbulizers, the circular radius at the crests and troughs is smaller than that shown in FIG. 7, resulting in a chevron or herringbone pattern in which the circular crests and troughs are connected by straight sections extending through the inflection points. The inventors have found that wavy fin turbulizers with chevron or herringbone profiles have suboptimal heat transfer performance vs. pressure drop, due to the presence of relatively sharp bends at the crests and troughs. Furthermore, as the circular radius of the crests and troughs is decreased, it approaches the shape of an angular corner, and such turbulizers become difficult or impossible to produce, due to manufacturing constraints.

Figure 8:
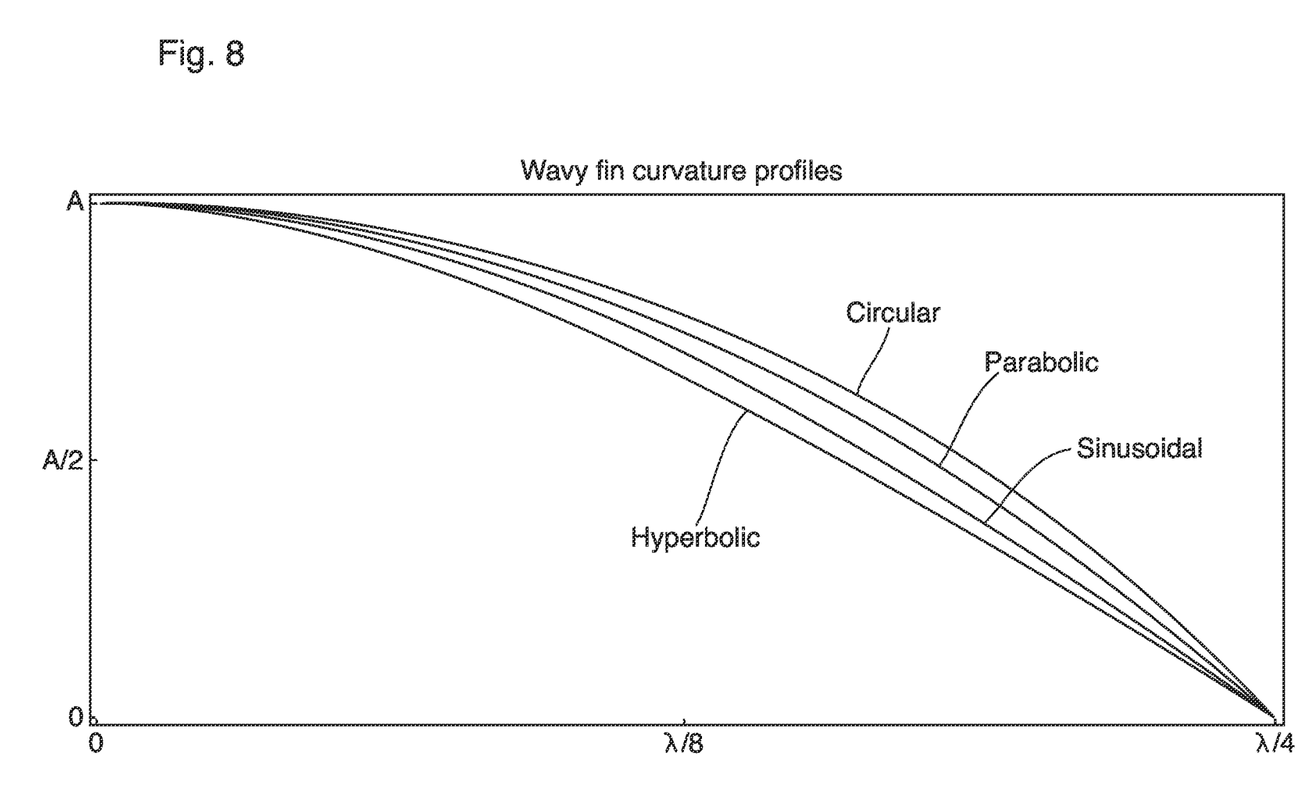
FIG. 8 is a graph of amplitude vs. wavelength for wavy fin turbulizers having various profiles.

Although FIG. 7 illustrates the benefits of providing the sidewalls 54 of a wavy fin turbulizer 34 with a hyperbolic profile, other non-circular sidewall profiles provide similar benefits. This is illustrated in FIG. 8, which shows the subtle distinctions between sidewalls having circular (A), parabolic (B), sinusoidal (C) and hyperbolic (D) profiles.

In some applications all internal surfaces of heat exchanger 10, including the wavy fin turbulizer 34, may require plating with a thin layer of metal. For example, where the turbulizer 34, plate walls 14, 20 and peripheral sidewall 28 are comprised of copper, it may be required to plate all surfaces within the fluid flow passage 26 with a thin, uniform layer of nickel. The plated surfaces are the surfaces which will be in contact with heat transfer fluid. This plating must be performed after the heat exchanger is assembled, by contacting all surfaces inside the fluid flow passage 26 with an aqueous plating solution. The plating process may comprise an electrolytic or electro-less plating process.

As shown in FIG. 3, the side channels 48, 50 along the side edges 44, 46 of turbulizer 34 are irregularly shaped due to the wavy construction of turbulizer 34, in that they include alternating wide and narrow areas along the length of turbulizer 34, the wide and narrow areas differing by about twice the amplitude A. Normally it is desired to minimize the width of side channels 48, 50 to minimize the volume of bypass flow through side channels 48, 50, which has a negative effect on heat exchanger performance. However, where plating of surfaces inside fluid flow passage 26 is required, sufficiently wide side channels 48, 50 must be maintained in order to permit the plating solution to uniformly plate all surfaces defining the side channels 48, 50, comprising the turbulizer 34, plate walls 14, 20 and peripheral sidewalls 28.

The inventors have found that defining the width of side channels 48, 50 in relation to the nominal width of flow channels 60 allows for complete and uniform plating of all internal surfaces within the fluid flow passage 26 of heat exchanger 10. In particular, the inventors have found that the ratio of minimum side channel (48, 50) width to flow channel (60) width should be at least ⅓ to provide complete and uniform plating within fluid flow passage 26.

The inventors have found that the negative effects of increased bypass flow through side channels 48, 50 is offset by the improved performance provided by the profile of the wavy fin turbulizer 34, which is discussed above.

In the present embodiment, where plating of internal surfaces is required, it is important that the wavy fin turbulizer 34 is properly positioned along the z-axis, to avoid one side channel 48 or 50 being too wide, and the other side channel 48 or 50 being too narrow. Ideally the wavy fin turbulizer 34 is centered between the first and second longitudinal portions of peripheral sidewall 28A, 28B, such that the side channels 48, 50 are of substantially equal width. In order to maintain proper position of turbulizer 34, it may be desirable to provide positioning elements protruding from the inner surfaces 16, 22 of the first and second plate walls 14, 20.

Examples of positioning elements 76 are illustrated in FIGS. 3 and 5. As shown in FIG. 3, a plurality of positioning elements 76 may be provided along each side edge 46, 48 of turbulizer 34. As shown in FIG. 5, the positioning elements 76 may be low, button-like projections or dimples protruding inwardly into the fluid flow passage 26 from the inner surface 22 of second plate wall 20. Alternatively, or in addition, similar positioning elements 76 may be provided on the inner surface 16 of first plate wall 14. Although not shown, additional positioning elements may be provided to maintain the longitudinal positioning (along x-axis) of turbulizer 34.

Although the wavy fin turbulizers 34 described herein have constant profiles throughout their length L and width W, this may not be essential in all embodiments. For example, the heat flux across the entire heat transfer surface 18 may not be constant, particularly where the heat exchanger 10 is configured as a cooling plate for cooling heat-generating components 12 such as power electronics components for battery or hybrid electric vehicles, wherein the heat is transferred to the heat transfer surface 18 only through the component substrate. The profile of the turbulizer 34 may be varied along its length and/or width to provide greater heat transfer performance in areas of higher heat flux (the substrates of components 12), and lower heat transfer performance in areas of lower heat flux (between the substrates of components 12). For example, in areas of lower heat flux, the flow channel width may be increased, amplitude decreased, and wavelength increased. Conversely, in areas of higher heat flux, the flow channel width may be decreased, amplitude increased, and wavelength decreased.

Figure 9:
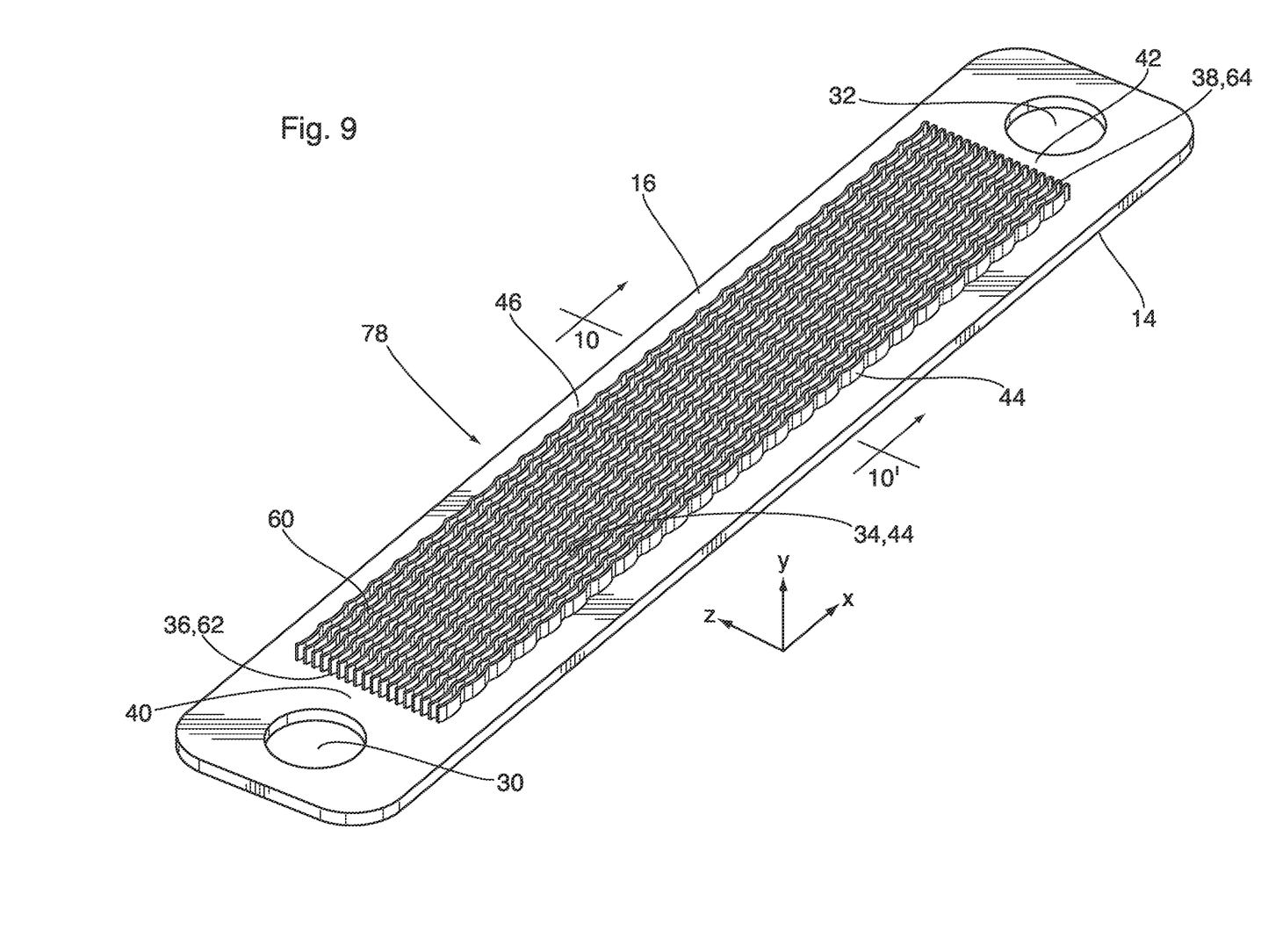
FIG. 9 shows a wavy fin turbulizer integrally formed with one of the plate walls of a heat exchanger.
Figure 10:
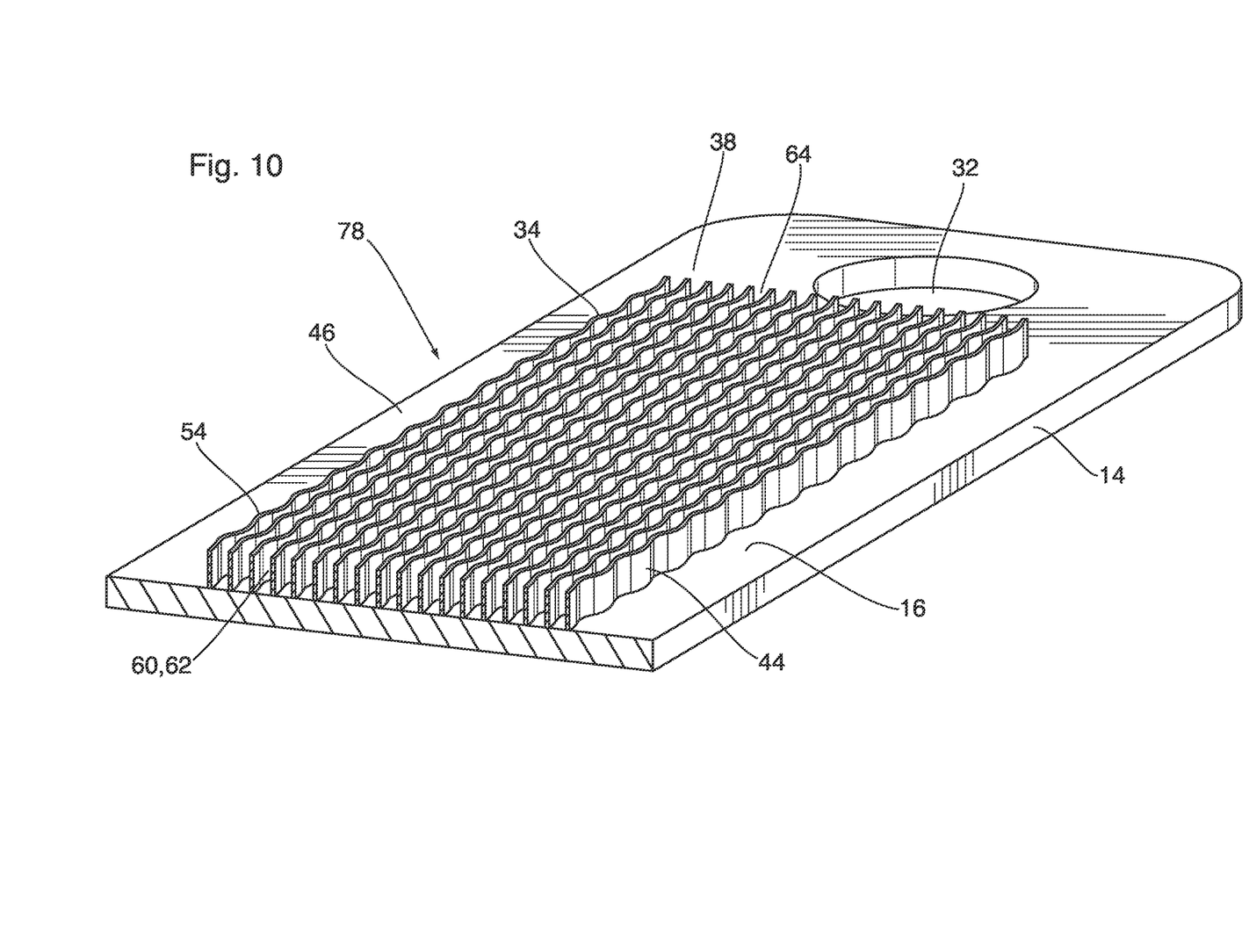
FIG. 10 is a cross-section along line 10-10' of FIG. 9.

As mentioned above, the heat exchanger 10 described herein may include a wavy fin turbulizer 34 which is integrated with one of the plate walls 14, 20, rather than being formed from a separate sheet of metal. FIGS. 9 and 10 show an example of such an integrated fin/plate wall structure 78, wherein the wavy fin turbulizer 34 is integrally formed with the first plate wall 14, for example by casting, impression casting and/or machining. The wavy fin turbulizer 34 comprises upstanding, fin-like sidewalls 54 projecting vertically (along y-axis) from the inner surface 16 of the first plate wall 14. Where the sidewalls 54 of wavy fin turbulizer 34 are integrally formed with one of the plate walls 14, 20, it is unnecessary to provide the wavy fin turbulizer 34 with top and bottom walls 56, 58 since the plate wall 14, 20 supports and maintains the position of the sidewalls 54. Accordingly, in the embodiment of FIGS. 9-10, the wavy fin turbulizer 34 does not include top or bottom walls 56, 58, and the sidewalls 54 are directly connected to the inner surface 16 of first plate wall 14. However, the wavy fin turbulizer 34 of FIGS. 9 and 10 includes the features described above, including constant, non-circular curvature of the sidewalls 54. In addition, the position of turbulizer 34 on plate wall 14, 20 is such that sufficiently wide side channels will be provided along the side edges 44, 46, once the integrated fin/plate 78 is incorporated into a heat exchanger as described above.

The integrated fin/plate 78 of FIGS. 9 and 10 may comprise a cover plate of heat exchanger 10, and be sealingly secured to the peripheral sidewall 28 by brazing or the like. In some cases part or all of the peripheral sidewall 28 may be integrated with the integrated fin/plate 78, and the inlet and outlet ports 30, 32 may be formed in the first plate wall 14 of integrated fin/plate 78.

Although the invention has been described in connection with certain embodiments, it is not restricted thereto. Rather, the invention includes all embodiments which may fall within the scope of the following claims.

What is claimed is:

1. A heat exchanger assembly having a fluid flow passage provided with a wavy fin turbulizer, the turbulizer comprising:
    a plurality of sidewalls extending lengthwise along a fluid flow direction between a first end and a second end of the turbulizer, the sidewalls being spaced apart across a width of the turbulizer;
    a plurality of flow channels, each said flow channel being defined between two of said sidewalls which are adjacent to one another, each said flow channel having a first open end at the first end of the turbulizer and a second open end at the second end of the turbulizer; wherein:
    each one of the sidewalls, independently, has a smoothly and continuously curved profile comprising a plurality of wave forms defined along the length of the turbulizer, the wave forms comprising a plurality of alternating crests and troughs, each wave form having a wavelength and an amplitude, wherein the continuously curved profile includes inflection points, each inflection point, independently, defined at a point midway between a crest and an adjacent trough wherein wherein a convex curvature defined by the wave form transitions to a concave curvature, the continuously curved profile configured such that each inflection point of a one of the plurality of sidewalls is disposed along a longitudinal line that extends parallel to a longitudinal axis of the heat exchanger, the longitudinal line intersecting each of the inflection points of the one of the plurality of sidewalls; and
    the plurality of wave forms are configured such that the continuously curved profile of each one of the plurality of sidewalls, independently, includes:
    an alternating arrangement of a plurality of continuously curved profile portions;
    each one of the plurality of continuously curved profile portions, independently, extending between an adjacent pair of inflection points of the continuously curved profile of the respective one of the plurality of sidewalls such that adjacent continuously curved profile portions extend on opposite sides of the longitudinal line that extends through each of the inflection points of the sidewall; and
    each one of the plurality of continuously curved profile portions, independently, forms part of a non-circular shape with effect that the flow channels of the turbulizer each, independently, have an inflection point channel width, as measured along an axis that extends normal to a first sidewall of the two adjacent sidewalls that define a respective one of the flow channels at the inflection point to a second sidewall of the two adjacent sidewalls that define the respective one of the flow channels, that is at least 85-95% of a channel width of the respective one of the flow channels as measured along an axis that extends normal to the first sidewall at a respective crest or trough to the second adjacent sidewall.

2. The heat exchanger assembly of claim 1, wherein the non-circular shape defining each one of the plurality of continuously curved profile portions is a non-circular conic section.

3. The heat exchanger assembly of claim 1, wherein the non-circular shape defining each one of the plurality of continuously curved profile portions is selected from the group consisting of: sinusoidal, elliptical, parabolic and hyperbolic.

4. The heat exchanger assembly of claim 1, wherein the inflection point channel width is 88% of the channel width measured along the axis that extends normal to the first sidewall a respective crest or trough of the first sidewall to the adjacent second sidewall.

5. The heat exchanger assembly of claim 1, further comprising a first plate wall and a second plate wall spaced apart from one another, the first and second plate walls each having an inner surface and an outer surface, wherein the fluid flow passage is defined between the inner surfaces of the first and second plate walls.

6. The heat exchanger assembly of claim 5, wherein the wavy fin turbulizer comprises first and second longitudinal side edges;
    wherein the heat exchanger further comprises a peripheral sidewall enclosing outer peripheral edges of the fluid flow passage, the peripheral sidewall including first and second longitudinally extending portions;
    wherein a first side channel is defined between the first longitudinal side edge of the turbulizer and the first longitudinally extending portion of the peripheral sidewall, and a second side channel is defined between the second longitudinal side edge of the turbulizer and the second longitudinally extending portion of the peripheral sidewall; and
    wherein the first and second side channels have alternating wide and narrow areas differing in width by about twice the amplitude of the wave forms.

7. The heat exchanger assembly of claim 1, wherein the wavy fin turbulizer further comprises a plurality of top walls and a plurality of bottom walls, wherein each of the top walls joins top edges of a pair of adjacent sidewalls and each of the bottom walls joins bottom edges of a pair of adjacent sidewalls, such that the wavy fin turbulizer comprises a plurality of longitudinally-extending corrugations arranged across its width.

8. The heat exchanger assembly of claim 7, further comprising a first plate wall and a second plate wall spaced apart from one another, the first and second plate walls each having an inner surface and an outer surface, wherein the fluid flow passage is defined between the inner surfaces of the first and second plate walls; and wherein the top walls of the wavy fin turbulizer are in contact with the inner surface of the first plate wall and the bottom walls of the wavy fin turbulizer are in contact with the inner surface of the second plate wall.

9. The heat exchanger assembly of claim 6, wherein interior surfaces of the fluid flow passage, including the turbulizer, the inner surfaces of the first and second plate walls, and the peripheral sidewall, include a thin layer of metal plating.

10. The heat exchanger assembly of claim 6, wherein each of the first and second side channels have a minimum side channel width which is defined by a width of one or more of the narrow areas, and wherein the minimum side channel width is at least ⅓ of the width of the flow channels of the turbulizer.

11. The heat exchanger assembly of claim 6, wherein the wavy fin turbulizer is substantially centered between the first and second longitudinally extending portions of the peripheral sidewall, such that the first and second side channels are of substantially the same width.

12. The heat exchanger assembly of claim 6, further comprising a plurality of positioning elements provided along the side edges of the wavy fin turbulizer, each of the positioning elements comprising a low, button-like projection or dimple protruding inwardly into the fluid flow passage from the inner surface of first plate wall or the second plate wall.

13. The heat exchanger assembly of claim 12, wherein a plurality of said positioning elements are provided along each of said side edges.

14. The heat exchanger assembly of claim 1, wherein the profile of the wavy fin turbulizer is varied along its length and/or its width, by varying one or more of the non-circular shape, amplitude, wavelength, and flow channel width.

15. The heat exchanger assembly of claim 1, further comprising a first plate wall and a second plate wall spaced apart from one another, the first and second plate walls each having an inner surface and an outer surface, wherein the fluid flow passage is defined between the inner surfaces of the first and second plate walls; and wherein the wavy fin turbulizer is integrally formed with the first plate wall.

16. The heat exchanger assembly of claim 15, wherein the sidewalls of the wavy fin turbulizer project from and are directly connected to the inner surface of the first plate wall.

17. The heat exchanger assembly as claimed in claim 1, wherein for each one of the plurality of sidewalls, independently, any portion of the continuously curved profile that extends between two spaced apart points disposed on the continuously curved profile, is a curved portion that forms part of a non-circular shape.

* * * * *

UNITED STATES PATENT AND TRADEMARK OFFICE
CERTIFICATE OF CORRECTION

| | | |
|---|---|---|
| PATENT NO. | : 12,215,933 B2 | Page 1 of 1 |
| APPLICATION NO. | : 17/107102 | |
| DATED | : February 4, 2025 | |
| INVENTOR(S) | : Andrei Catuneanu, John G. Burgers and Kenneth M. A. Abels | |

It is certified that error appears in the above-identified patent and that said Letters Patent is hereby corrected as shown below:

In the Claims

In Claim 1, Lines 54-55, the duplicated word "wherein" should be removed.

Signed and Sealed this
Thirteenth Day of May, 2025

Coke Morgan Stewart
*Acting Director of the United States Patent and Trademark Office*